US008284833B2

(12) United States Patent
Jin et al.

(10) Patent No.: US 8,284,833 B2
(45) Date of Patent: Oct. 9, 2012

(54) SERIAL CONCATENATION OF INTERLEAVED CONVOLUTIONAL CODES FORMING TURBO-LIKE CODES

(75) Inventors: Hui Jin, Glen Gardner, NJ (US); Aamod Khandekar, Pasadena, CA (US); Robert J. McEliece, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 13/073,947

(22) Filed: Mar. 28, 2011

(65) Prior Publication Data

US 2011/0264985 A1 Oct. 27, 2011

Related U.S. Application Data

(63) Continuation of application No. 12/165,606, filed on Jun. 30, 2008, now Pat. No. 7,916,781, which is a continuation of application No. 11/542,950, filed on Oct. 3, 2006, now Pat. No. 7,421,032, which is a continuation of application No. 09/861,102, filed on May 18, 2001, now Pat. No. 7,116,710, which is a continuation-in-part of application No. 09/922,852, filed on Aug. 18, 2000, now Pat. No. 7,089,477.

(60) Provisional application No. 60/205,095, filed on May 18, 2000.

(51) Int. Cl.
*H04B 1/66* (2006.01)

(52) U.S. Cl. ........ 375/240; 375/285; 375/296; 714/801; 714/804

(58) Field of Classification Search .................. 375/240, 375/240.24, 254, 285, 295, 296, 260; 714/755, 714/758, 800, 801, 804, 805
See application file for complete search history.

(56) References Cited

U.S. PATENT DOCUMENTS

| 5,181,207 A | 1/1993 | Chapman |
| 5,392,299 A | 2/1995 | Rhines et al. |
| 5,530,707 A | 6/1996 | Lin |
| 5,751,739 A | 5/1998 | Seshadri et al. |
| 5,802,115 A | 9/1998 | Meyer |
| 5,881,093 A | 3/1999 | Wang et al. |
| 5,956,351 A * | 9/1999 | Bossen et al. ................. 714/757 |
| 6,014,411 A | 1/2000 | Wang |
| 6,023,783 A | 2/2000 | Divsalar et al. |
| 6,031,874 A | 2/2000 | Chennakeshu et al. |
| 6,032,284 A | 2/2000 | Bliss |
| 6,044,116 A | 3/2000 | Wang |
| 6,094,739 A | 7/2000 | Miller et al. |
| 6,195,396 B1 | 2/2001 | Fang et al. |
| 6,396,423 B1 | 5/2002 | Laumen et al. |
| 6,437,714 B1 | 8/2002 | Kim et al. |
| 6,732,328 B1 | 5/2004 | McEwen et al. |

(Continued)

OTHER PUBLICATIONS

Aji, S.M., et al., "The Generalized Distributive Law," IEEE Transactions on Information Theory, 46(2):325-343, Mar. 2000.

(Continued)

*Primary Examiner* — Dac Ha
(74) *Attorney, Agent, or Firm* — Perkins Coie LLP

(57) ABSTRACT

A serial concatenated coder includes an outer coder and an inner coder. The outer coder irregularly repeats bits in a data block according to a degree profile and scrambles the repeated bits. The scrambled and repeated bits are input to an inner coder, which has a rate substantially close to one.

14 Claims, 5 Drawing Sheets

U.S. PATENT DOCUMENTS

| | | | |
|---|---|---|---|
| 6,859,906 | B2 | 2/2005 | Hammons et al. |
| 7,089,477 | B1 | 8/2006 | Divsalar et al. |
| 7,116,710 | B1 | 10/2006 | Jin et al. |
| 7,421,032 | B2 | 9/2008 | Jin et al. |
| 7,916,781 | B2 | 3/2011 | Jin et al. |
| 7,934,146 | B2 * | 4/2011 | Stolpman ............... 714/800 |
| 2001/0025358 | A1 | 9/2001 | Eidson et al. |
| 2007/0025450 | A1 | 2/2007 | Jin et al. |
| 2008/0263425 | A1 * | 10/2008 | Lakkis ............... 714/752 |
| 2008/0294964 | A1 | 11/2008 | Jin et al. |

OTHER PUBLICATIONS

Benedetto, S., et al., "A Soft-Input Soft-Output APP Module for Iterative Decoding of Concatenated Codes," IEEE Communications Letters, 1(1):22-24, Jan. 1997.

Benedetto, S., et al., "A Soft-Input Soft-Output Maximum a Posteriori (MAP) Module to Decode Parallel and Serial Concatenated Codes," The Telecommunications and Data Acquisition Progress Report (TDA PR 42-127), pp. 1-20, Nov. 1996.

Benedetto, S., et al., "Bandwidth efficient parallel concatenated coding schemes," Electronics Letters, 31 (24):2067-2069, Nov. 1995.

Benedetto, S., et al., "Design of Serially Concatenated Interleaved Codes," ICC 97, vol. 2, pp. 710-714, Jun. 1997.

Benedetto, S., et al., "Parallel Concatenated Trellis Coded Modulation," ICC 96, vol. 2, pp. 974-978, Jun. 1996.

Benedetto, S., et al., "Serial Concatenated Trellis Coded Modulation with Iterative Decoding," Proceedings 1997 IEEE International Symposium on Information Theory (ISIT), Ulm, Germany, p. 8, Jun. 29-Jul. 4, 1997.

Benedetto, S., et al., "Serial Concatenation of Interleaved Codes: Performance Analysis, Design, and Iterative Decoding," The Telecommunications and Data Acquisition Progress Report (TDA PR 42-126), pp. 1-26, Aug. 1996.

Benedetto, S., et al., "Serial concatenation of interleaved codes: performance analysis, design, and iterative decoding," Proceedings 1997 IEEE International Symposium on Information Theory (ISIT), Ulm, Germany, p. 106, Jun. 29-Jul. 4, 1997.

Benedetto, S., et al., "Soft-Output Decoding Algorithms in Iterative Decoding of Turbo Codes," The Telecommunications and Data Acquisition Progress Report (TDA PR 42-124), pp. 63-87, Feb. 1996.

Berrou, C., et al., "Near Shannon Limit Error—Correcting Coding and Decoding: Turbo Codes," ICC 93, vol. 2, pp. 1064-1070, May 1993.

Digital Video Broadcasting (DVB)—User guidelines for the second generation system for Broadcasting, Interactive Services, News Gathering and other broadband satellite applications (DVB-S2), ETSI TR 102 376 V1.1.1 Technical Report, pp. 1-104 (p. 64), Feb. 2005.

Divsalar, D., et al., "Coding Theorems for 'Turbo-Like' Codes," Proceedings of the 36th Annual Allerton Conference on Communication, Control, and Computing, Monticello, Illinois, pp. 201-210, Sep. 1998.

Divsalar, D., et al., "Effective free distance of turbo codes," Electronics Letters, 32(5):445-446, Feb. 1996.

Divsalar, D., et al., "Hybrid Concatenated Codes and Iterative Decoding," Proceedings 1997 IEEE International Symposium on Information Theory (ISIT), Ulm, Germany, p. 10, Jun. 29-Jul. 4, 1997.

Divsalar, D., et al., "Low-Rate Turbo Codes for Deep-Space Communications," Proceedings 1995 IEEE International Symposium on Information Theory (ISIT), Whistler, BC, Canada, p. 35, Sep. 1995.

Divsalar, D., et al., "Multiple Turbo Codes for Deep-Space Communications," The Telecommunications and Data Acquisition Progress Report (TDA PR 42-121), pp. 66-77, May 1995.

Divsalar, D., et al., "Multiple Turbo Codes," MILCOM '95, vol. 1, pp. 279-285, Nov. 1995.

Divsalar, D., et al., "On the Design of Turbo Codes," The Telecommunications and Data Acquisition Progress Report (TDA PR 42-123), pp. 99-121, Nov. 1995.

Divsalar, D., et al., "Serial Turbo Trellis Coded Modulation with Rate-1 Inner Code," Proceedings 2000 IEEE International Symposium on Information Theory (ISIT), Sorrento, Italy, pp. 194, Jun. 2000.

Divsalar, D., et al., "Turbo Codes for PCS Applications," IEEE ICC '95, Seattle, WA, USA, vol. 1, pp. 54-59, Jun. 1995.

Jin, H., et al., "Irregular Repeat—Accumulate Codes," 2nd International Symposium on Turbo Codes, Brest, France, 25 pages, Sep. 2000.

Jin, H., et al., "Irregular Repeat—Accumulate Codes," 2nd International Symposium on Turbo Codes & Related Topics, Brest, France, p. 1-8, Sep. 2000.

Richardson, T.J., et al., "Design of Capacity-Approaching Irregular Low-Density Parity-Check Codes," IEEE Transactions on Information Theory, 47(2):619-637, Feb. 2001.

Richardson, T.J., et al., "Efficient Encoding of Low-Density Parity-Check Codes," IEEE Transactions on Information Theory, 47(2):638-656, Feb. 2001.

Tanner, R.M., "A Recursive Approach to Low Complexity Codes," IEEE Transactions on Information Theory, 27 (5):533-547, Sep. 1981.

Wiberg, N., et al., "Codes and Iterative Decoding on General Graphs," Proceedings 1995 IEEE International Symposium on Information Theory (ISIT), Whistler, BC, Canada, p. 468, Sep. 1995.

* cited by examiner

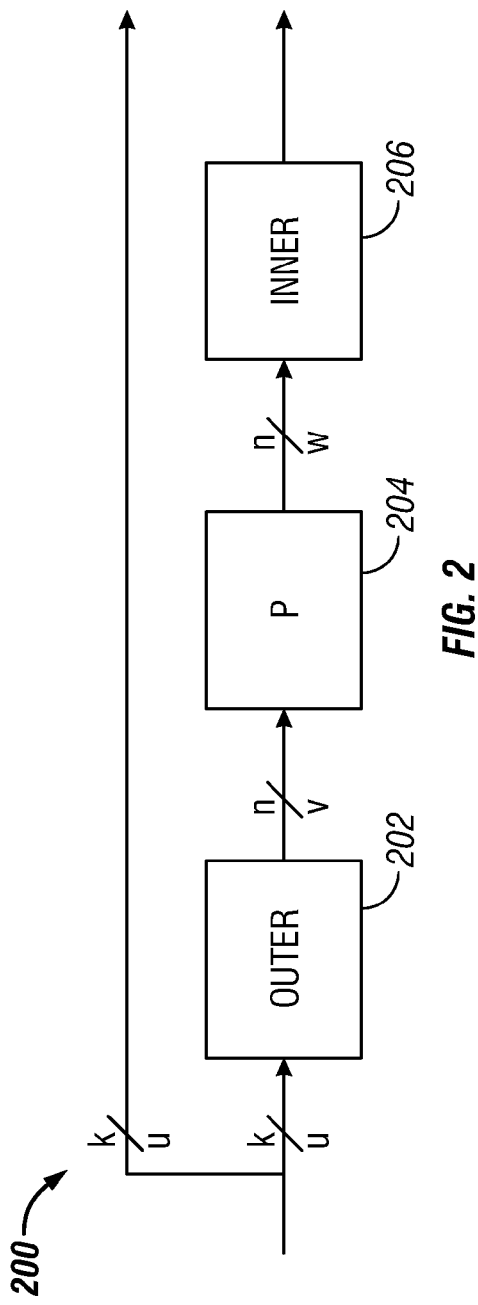
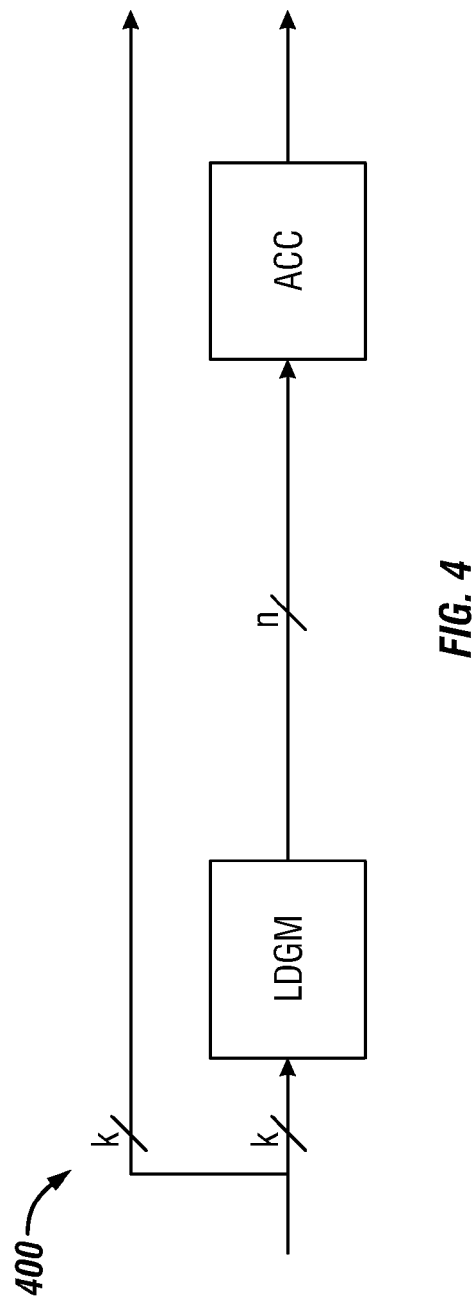

SERIAL CONCATENATION OF INTERLEAVED CONVOLUTIONAL CODES FORMING TURBO-LIKE CODES

CROSS-REFERENCE TO RELATED APPLICATIONS

This application is a continuation of U.S. application Ser. No. 12/165,606, filed Jun. 30, 2008 now U.S. Pat. No. 7,916,781, which is a continuation of U.S. application Ser. No. 11/542,950, filed Oct. 3, 2006, now U.S. Pat. No. 7,421,032, which is a continuation of U.S. application Ser. No. 09/861,102, filed May 18, 2001, now U.S. Pat. No. 7,116,710, which claims the priority of U.S. Provisional Application Ser. No. 60/205,095, filed May 18, 2000, and is a continuation-in-part of U.S. application Ser. No. 09/922,852, filed Aug. 18, 2000, now U.S. Pat. No. 7,089,477. The disclosures of the prior applications are considered part of (and are incorporated by reference in) the disclosure of this application.

GOVERNMENT LICENSE RIGHTS

The U.S. Government has a paid-up license in this invention and the right in limited circumstances to require the patent owner to license others on reasonable terms as provided for by the terms of Grant No. CCR-9804793 awarded by the National Science Foundation.

BACKGROUND

Properties of a channel affect the amount of data that can be handled by the channel. The so-called "Shannon limit" defines the theoretical limit of the amount of data that a channel can carry.

Different techniques have been used to increase the data rate that can be handled by a channel. "Near Shannon Limit Error-Correcting Coding and Decoding: Turbo Codes," by Berrou et al. ICC, pp 1064-1070, (1993), described a new "turbo code" technique that has revolutionized the field of error correcting codes. Turbo codes have sufficient randomness to allow reliable communication over the channel at a high data rate near capacity. However, they still retain sufficient structure to allow practical encoding and decoding algorithms. Still, the technique for encoding and decoding turbo codes can be relatively complex.

A standard turbo coder 100 is shown in FIG. 1. A block of k information bits is input directly to a first coder 102. A k bit interleaver 106 also receives the k bits and interleaves them prior to applying them to a second coder 104. The second coder produces an output that has more bits than its input, that is, it is a coder with rate that is less than 1. The coders 102, 104 are typically recursive convolutional coders.

Three different items are sent over the channel 150: the original k bits, first encoded bits 110, and second encoded bits 112. At the decoding end, two decoders are used: a first constituent decoder 160 and a second constituent decoder 162. Each receives both the original k bits, and one of the encoded portions 110, 112. Each decoder sends likelihood estimates of the decoded bits to the other decoders. The estimates are used to decode the uncoded information bits as corrupted by the noisy channel.

SUMMARY

A coding system according to an embodiment is configured to receive a portion of a signal to be encoded, for example, a data block including a fixed number of bits. The coding system includes an outer coder, which repeats and scrambles bits in the data block. The data block is apportioned into two or more sub-blocks, and bits in different sub-blocks are repeated a different number of times according to a selected degree profile. The outer coder may include a repeater with a variable rate and an interleaver. Alternatively, the outer coder may be a low-density generator matrix (LDGM) coder.

The repeated and scrambled bits are input to an inner coder that has a rate substantially close to one. The inner coder may include one or more accumulators that perform recursive modulo two addition operations on the input bit stream.

The encoded data output from the inner coder may be transmitted on a channel and decoded in linear time at a destination using iterative decoding techniques. The decoding techniques may be based on a Tanner graph representation of the code.

BRIEF DESCRIPTION OF THE DRAWINGS

FIG. 2 is a schematic diagram of a coder according to an embodiment.

FIG. 4 is a schematic diagram of an IRA coder according to an embodiment.

DETAILED DESCRIPTION

Figure 1:
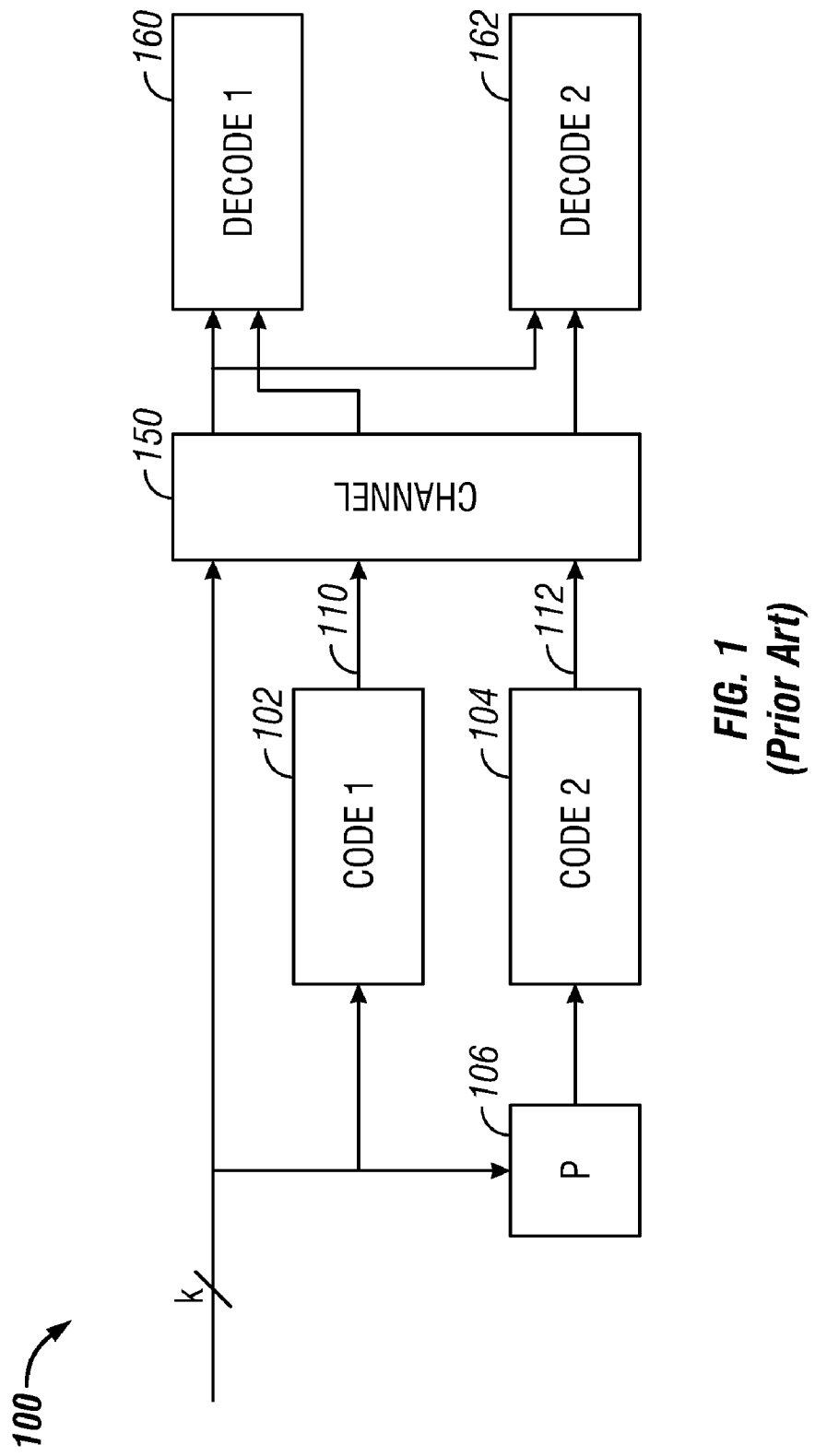
FIG. 1 is a schematic diagram of a prior "turbo code" system.

FIG. 2 illustrates a coder 200 according to an embodiment. The coder 200 may include an outer coder 202, an interleaver 204, and inner coder 206. The coder may be used to format blocks of data for transmission, introducing redundancy into the stream of data to protect the data from loss due to transmission errors. The encoded data may then be decoded at a destination in linear time at rates that may approach the channel capacity.

The outer coder 202 receives the uncoded data. The data may be partitioned into blocks of fixed size, say k bits. The outer coder may be an (n,k) binary linear block coder, where n>k. The coder accepts as input a block u of k data bits and produces an output block v of n data bits. The mathematical relationship between u and v is $v = T_0 u$, where $T_0$ is an n×k matrix, and the rate of the coder is k/n.

The rate of the coder may be irregular, that is, the value of $T_0$ is not constant, and may differ for sub-blocks of bits in the data block. In an embodiment, the outer coder 202 is a repeater that repeats the k bits in a block a number of times q to produce a block with n bits, where n=qk. Since the repeater has an irregular output, different bits in the block may be repeated a different number of times. For example, a fraction of the bits in the block may be repeated two times, a fraction of bits may be repeated three times, and the remainder of bits may be repeated four times. These fractions define a degree sequence, or degree profile, of the code.

The inner coder 206 may be a linear rate-1 coder, which means that the n-bit output block x can be written as $x = T_I w$, where $T_I$ is a nonsingular n×n matrix. The inner coder 210 can have a rate that is close to 1, e.g., within 50%, more preferably 10% and perhaps even more preferably within 1% of I.

In an embodiment, the inner coder 206 is an accumulator, which produces outputs that are the modulo two (mod-2) partial sums of its inputs. The accumulator may be a truncated rate-1 recursive convolutional coder with the transfer function 1/(1+D). Such an accumulator may be considered a block coder whose input block $[x_1, \ldots, x_n]$ and output block $[y_1, \ldots, y_n]$ are related by the formula $$y_1 = x_1$$

$$y_2 = x_1 \oplus x_2$$

$$y_3 = x_1 \oplus x_2 \oplus x_3$$

$$\cap$$

$$y_n = x_1 \oplus x_2 \oplus x_3 \oplus \ldots \oplus x_n$$

where "$\oplus$" denotes mod-2, or exclusive-OR (XOR), addition. An advantage of this system is that only mod-2 addition is necessary for the accumulator. The accumulator may be embodied using only XOR gates, which may simplify the design.

The bits output from the outer coder 202 are scrambled before they are input to the inner coder 206. This scrambling may be performed by the interleaver 204, which performs a pseudo-random permutation of an input block v, yielding an output block w having the same length as v.

Figure 3:
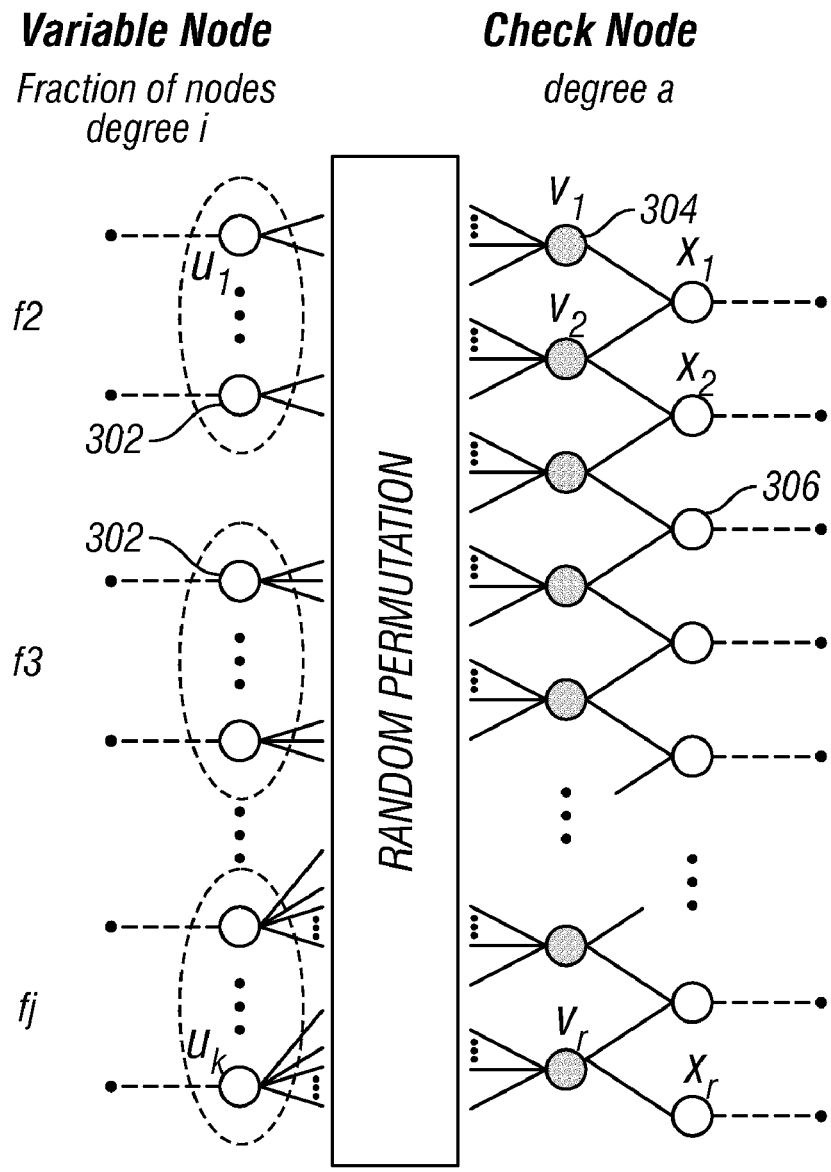
FIG. 3 is a Tanner graph for an irregular repeat and accumulate (IRA) coder.

The serial concatenation of the interleaved irregular repeat code and the accumulate code produces an irregular repeat and accumulate (IRA) code. An IRA code is a linear code, and as such, may be represented as a set of parity checks. The set of parity checks may be represented in a bipartite graph, called the Tanner graph, of the code. FIG. 3 shows a Tanner graph 300 of an IRA code with parameters $(f_1, \ldots, f_j; a)$, where $f_i \geq 0$, $\Sigma_i f_i = 1$ and "a" is a positive integer. The Tanner graph includes two kinds of nodes: variable nodes (open circles) and check nodes (filled circles). There are k variable nodes 302 on the left, called information nodes. There are r variable nodes 306 on the right, called parity nodes. There are $r = (k\Sigma_i i f_i)/a$ check nodes 304 connected between the information nodes and the parity nodes. Each information node 302 is connected to a number of check nodes 304. The fraction of information nodes connected to exactly i check nodes is $f_i$. For example, in the Tanner graph 300, each of the $f_2$ information nodes are connected to two check nodes, corresponding to a repeat of q=2, and each of the $f_3$ information nodes are connected to three check nodes, corresponding to q=3.

Each check node 304 is connected to exactly "a" information nodes 302. In FIG. 3, a=3. These connections can be made in many ways, as indicated by the arbitrary permutation of the ra edges joining information nodes 302 and check nodes 304 in permutation block 310. These connections correspond to the scrambling performed by the interleaver 204.

In an alternate embodiment, the outer coder 202 may be a low-density generator matrix (LDGM) coder that performs an irregular repeat of the k bits in the block, as shown in FIG. 4. As the name implies, an LDGM code has a sparse (low-density) generator matrix. The IRA code produced by the coder 400 is a serial concatenation of the LDGM code and the accumulator code. The interleaver 204 in FIG. 2 may be excluded due to the randomness already present in the structure of the LDGM code.

If the permutation performed in permutation block 310 is fixed, the Tanner graph represents a binary linear block code with k information bits $(u_1, \ldots, u_k)$ and r parity bits $(x_1, \ldots, x_r)$, as follows. Each of the information bits is associated with one of the information nodes 302, and each of the parity bits is associated with one of the parity nodes 306. The value of a parity bit is determined uniquely by the condition that the mod-2 sum of the values of the variable nodes connected to each of the check nodes 304 is zero. To see this, set $x_0 = 0$. Then if the values of the bits on the ra edges coming out the permutation box are $(v_1, \ldots, v_{ra})$, then we have the recursive formula for j=1, 2, . . . , r. This is in effect the encoding algorithm.

Two types of IRA codes are represented in FIG. 3, a nonsystematic version and $$x_j = x_{j-1} + \sum_{i=1}^{a} v_{(j-1)a+i}$$

a systematic version. The nonsystematic version is an (r,k) code, in which the codeword corresponding to the information bits $(u_1, \ldots, u_k)$ is $(x_1, \ldots, x_r)$. The systematic version is a (k+r, k) code, in which the codeword is $(u_1, \ldots, u_k; x_1, \ldots, x_r)$.

$$R_{nsys} = \frac{a}{\sum_i i f_i}$$

The rate of the nonsystematic code is
The rate of the systematic code is $$R_{sys} = \frac{a}{a + \sum_i i f_i}$$

For example, regular repeat and accumulate (RA) codes can be considered nonsystematic IRA codes with a=1 and exactly one $f_i$ equal to 1, say $f_q = 1$, and the rest zero, in which case $R_{nsys}$ simplifies to R=1/q.

The IRA code may be represented using an alternate notation. Let $\lambda_i$ be the fraction of edges between the information nodes 302 and the check nodes 304 that are $$f_i = \frac{\lambda_i / i}{\sum_j \lambda_j / j}$$

adjacent to an information node of degree i, and let $\rho_i$ be the fraction of such edges that are adjacent to a check node of degree i+2 (i.e., one that is adjacent to i information nodes). These edge fractions may be used to represent the IRA code rather than the corresponding node fractions. Define $\lambda(x) = \Sigma_i \lambda_i x^{i-1}$ and $\rho(x) = \Sigma_i \rho_i x^{i-1}$ to be the generating functions of these sequences. The pair $(\lambda, \rho)$ is called a degree distribution. For $L(x) = \Sigma_i f_i x_i$, The rate of the systematic IRA code given by the degree distribution is given by $$L(x) = \int_0^x \lambda(t) dt \bigg/ \int_0^1 \lambda(t) dt$$

$$\text{Rate} = \left(1 + \frac{\sum_j \rho_j/j}{\sum_j \lambda_j/j}\right)^{-1}$$

Figure 5A:
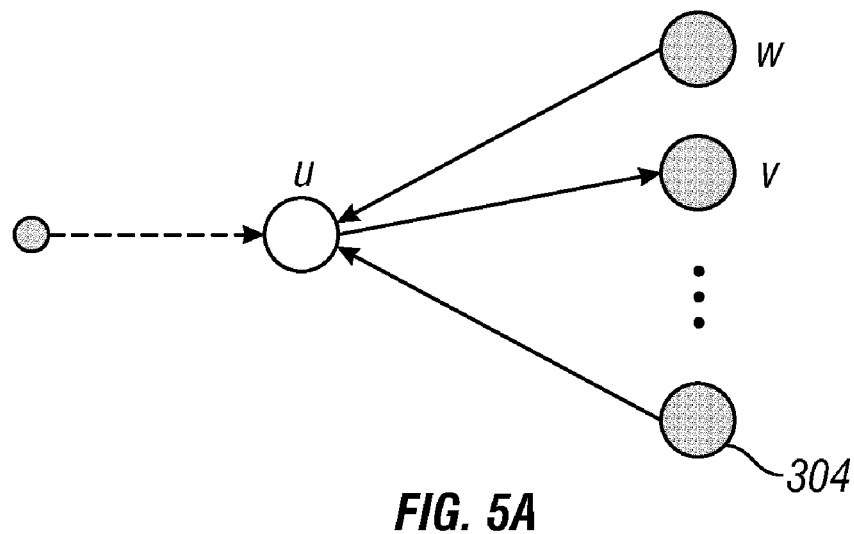
FIG. 5A illustrates a message from a variable node to a check node on the Tanner graph of FIG. 3.
Figure 5B:
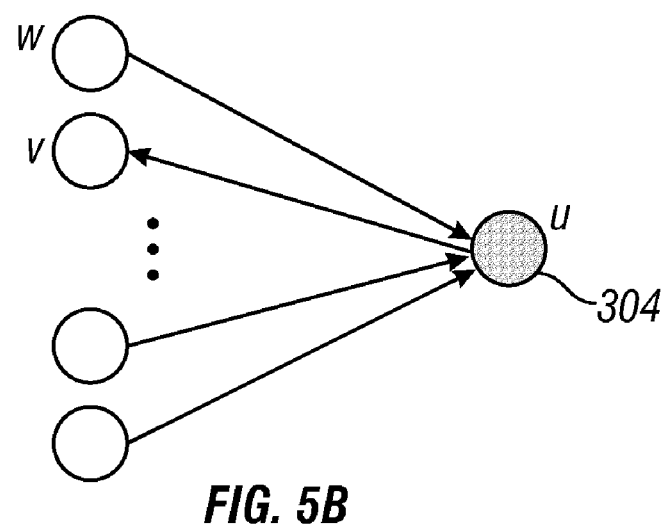
FIG. 5B illustrates a message from a check node to a variable node on the Tanner graph of FIG. 3.

"Belief propagation" on the Tanner Graph realization may be used to decode IRA codes. Roughly speaking, the belief propagation decoding technique allows the messages passed on an edge to represent posterior densities on the bit associated with the variable node. A probability density on a bit is a pair of non-negative real numbers p(0), p(1) satisfying p(0)+p(1)=1, where p(0) denotes the probability of the bit being 0, p(1) the probability of it being 1. Such a pair can be represented by its log likelihood ratio, m=log(p(0)/p(1)). The outgoing message from a variable node u to a check node v represents information about u, and a message from a check node u to a variable node v represents information about u, as shown in FIGS. 5A and 5B, respectively.

The outgoing message from a node u to a node v depends on the incoming messages from all neighbors w of u except v. If u is a variable message node, this outgoing message is $$m(u \to v) = \sum_{w \neq v} m(w \to u) + m_0(u)$$

where $m_0(u)$ is the log-likelihood message associated with u. If u is a check node, the $$\tanh\frac{m(u \to v)}{2} = \prod_{w \neq v} \tanh\frac{m(w \to u)}{2}$$

corresponding formula is

Before decoding, the messages m(w→u) and m(u→v) are initialized to be zero, and $m_0(u)$ is initialized to be the log-likelihood ratio based on the channel received information. If the channel is memoryless, i.e., each channel output only relies on its input, and y is the output of the channel code bit u, then $m_0(u)$=log(p(u=0|y)/p(u=1|y)). After this initialization, the decoding process may run in a fully parallel and local manner. In each iteration, every variable/check node receives messages from its neighbors, and sends back updated messages. Decoding is terminated after a fixed number of iterations or detecting that all the constraints are satisfied. Upon termination, the decoder outputs a decoded sequence based on the messages $m(u) = \Sigma w_m(w \to u)$.

Thus, on various channels, iterative decoding only differs in the initial messages $m_0(u)$. For example, consider three memoryless channel models: a binary erasure channel (BEC); a binary symmetric channel (BSC); and an additive white Gaussian noise (AGWN) channel.

In the BEC, there are two inputs and three outputs. When 0 is transmitted, the receiver can receive either 0 or an erasure E. An erasure E output means that the receiver does not know how to demodulate the output. Similarly, when 1 is transmitted, the receiver can receive either 1 or E. Thus, for the BEC, y∈{0, E, 1}, and In the BSC, there are two possible inputs (0,1) and two possible outputs (0, 1).

$$m_0(u) = \begin{cases} +\infty & \text{if } y = 0 \\ 0 & \text{if } y = E \\ -\infty & \text{if } y = 1 \end{cases}$$

The BSC is characterized by a set of conditional probabilities relating all possible outputs to possible inputs. Thus, for the BSC y∈{0, 1}, and $$m_0(u) = \begin{cases} \log\frac{1-p}{p} & \text{if } y = 0 \\ -\log\frac{1-p}{p} & \text{if } y = 1 \end{cases}$$

In the AWGN, the discrete-time input symbols X take their values in a finite alphabet while channel output symbols Y can take any values along the real line. There is assumed to be no distortion or other effects other than the addition of white Gaussian noise. In an AWGN with a Binary Phase Shift Keying (BPSK) signaling which maps 0 to the symbol with amplitude $\sqrt{E_s}$ and 1 to the symbol with amplitude $-\sqrt{E_s}$, output y∈R, then $$m_0(u) = 4y\sqrt{E_s}/N_0$$

where $N_0/2$ is the noise power spectral density.

The selection of a degree profile for use in a particular transmission channel is a design parameter, which may be affected by various attributes of the channel. The criteria for selecting a particular degree profile may include, for example, the type of channel and the data rate on the channel. For example, Table 1 shows degree profiles that have been found to produce good results for an AWGN channel model.

TABLE 1

| a | 2 | 3 | 4 |
|---|---|---|---|
| λ2 | 0.139025 | 0.078194 | 0.054485 |
| λ3 | 0.2221555 | 0.128085 | 0.104315 |
| λ5 | | 0.160813 | |
| λ6 | 0.638820 | 0.036178 | 0.126755 |
| λ10 | | | 0.229816 |
| λ11 | | | 0.016484 |
| λ12 | | 0.108828 | |
| λ13 | | 0.487902 | |
| λ14 | | | |
| λ16 | | | |
| λ27 | | | 0.450302 |
| λ28 | | | 0.017842 |
| Rate | 0.333364 | 0.333223 | 0.333218 |
| σGA | 1.1840 | 1.2415 | 1.2615 |
| σ* | 1.1981 | 1.2607 | 1.2780 |
| (Eb/N0) * (dB) | 0.190 | −0.250 | −0.371 |
| S.L. (dB) | −0.4953 | −0.4958 | −0.4958 |

Table 1 shows degree profiles yielding codes of rate approximately ⅓ for the AWGN channel and with a=2, 3, 4. For each sequence, the Gaussian approximation noise threshold, the actual sum-product decoding threshold and the corresponding energy per bit ($E_b$)-noise power ($N_0$) ratio in dB are given. Also listed is the Shannon limit (S.L.).

As the parameter "a" is increased, the performance improves. For example, for a=4, the best code found has an iterative decoding threshold of $E_b/N_0$=−0.371 dB, which is only 0.12 dB above the Shannon limit.

Figure 6:
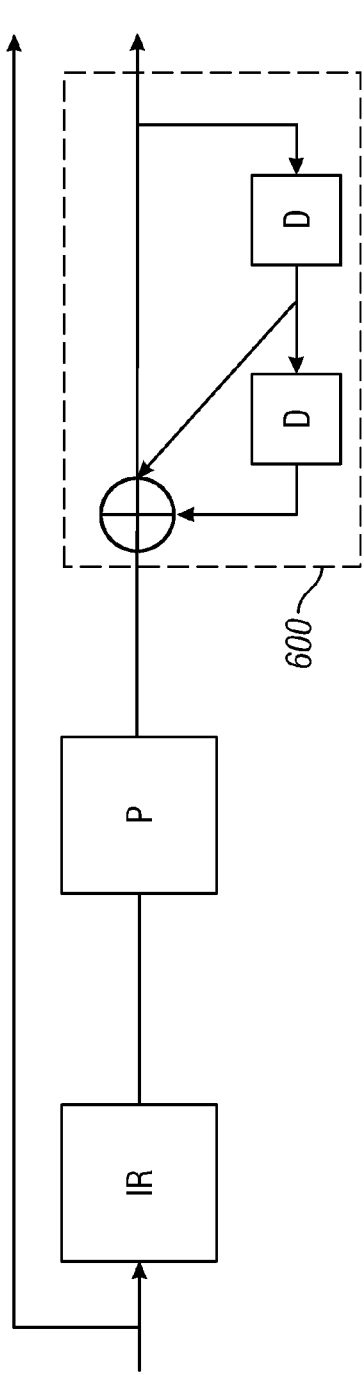
FIG. 6 is a schematic diagram of a coder according to an alternate embodiment.

The accumulator component of the coder may be replaced by a "double accumulator" 600 as shown in FIG. 6. The double accumulator can be viewed as a truncated rate 1 convolutional coder with transfer function $1/(1+D+D^2)$.

Figure 7:
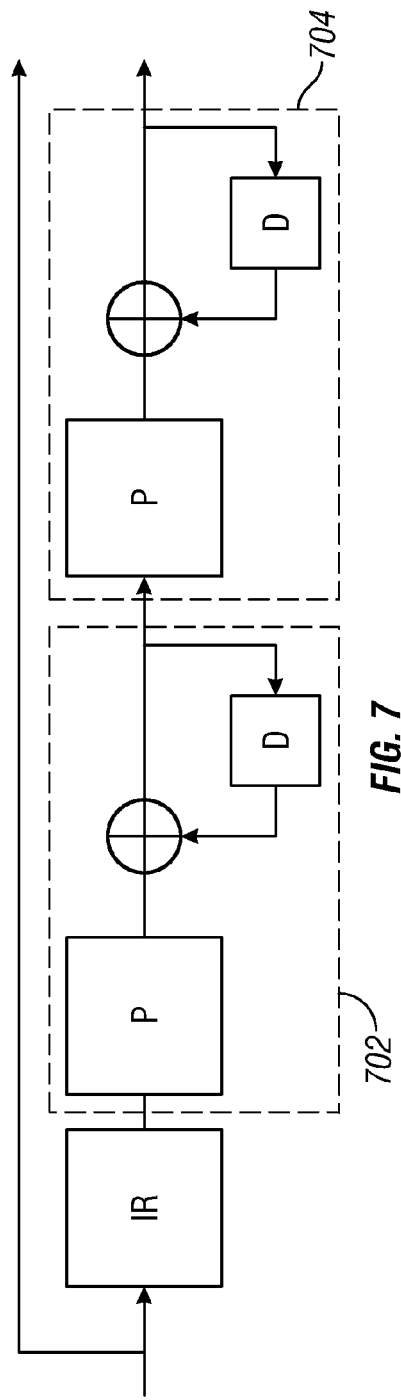
FIG. 7 is a schematic diagram of a coder according to another alternate embodiment.

Alternatively, a pair of accumulators may be the added, as shown in FIG. 7. There are three component codes: the "outer" code 700, the "middle" code 702, and the "inner" code 704. The outer code is an irregular repetition code, and the middle and inner codes are both accumulators.

IRA codes may be implemented in a variety of channels, including memoryless channels, such as the BEC, BSC, and AWGN, as well as channels having non-binary input, non-symmetric and fading channels, and/or channels with memory.

A number of embodiments have been described. Nevertheless, it will be understood that various modifications may be made without departing from the spirit and scope of the invention. Accordingly, other embodiments are within the scope of the following claims.

What is claimed is:

1. An apparatus for performing encoding operations, the apparatus comprising:
    a first set of memory locations to store information bits;
    a second set of memory locations to store parity bits;
    a permutation module to read a bit from the first set of memory locations and combine the read bit to a bit in the second set of memory locations based on a corresponding index of the first set of memory locations and a corresponding index of the second set of memory locations; and
    an accumulator to perform accumulation operations on the bits stored in the second set of memory locations,
    wherein two or more memory locations of the first set of memory locations are read by the permutation module different times from one another.

2. The apparatus of claim 1, wherein the permutation module is configured to perform the combine operation to include performing mod-2 or exclusive-OR sum.

3. The apparatus of claim 2, wherein the permutation module is configured to perform the combining operation to further include writing the sum to the second set of memory locations based on a corresponding index.

4. The apparatus of claim 1, wherein the accumulator is configured to perform the accumulation operation to include a mod-2 or exclusive-OR sum of the bit stored in a prior index to a bit stored in a current index based on a corresponding index of the second set of memory locations.

5. The apparatus of claim 4, wherein the accumulator is configured to perform the accumulation operation to at least 2 consecutive indices of the second set of memory locations.

6. The apparatus of claim 1, wherein the permutation module further comprises a permutation information module to generate pairs of an index of the first set of memory locations and an index of the second set of memory locations.

7. The apparatus of claim 6, wherein at least one index of the second set of memory locations is used twice.

8. A method of performing encoding operations, the method comprising:
    receiving a sequence of information bits from a first set of memory locations;
    performing an encoding operation using the received sequence of information bits as an input, said encoding operation comprising:
        reading a bit from the received sequence of information bits, and
        combining the read bit to a bit in a second set of memory locations based on a corresponding index of the first set of memory locations for the received sequence of information bits and a corresponding index of the second set of memory locations; and
    accumulating the bits in the second set of memory locations,
    wherein two or more memory locations of the first set of memory locations are read by the permutation module different times from one another.

9. The method of claim 8, wherein performing the combine operation comprises performing mod-2 or exclusive-OR sum.

10. The method of claim 9, wherein performing the combine operation comprises writing the sum to the second set of memory locations based on a corresponding index.

11. The method of claim 8, wherein performing the accumulation operation comprises performing a mod-2 or exclusive-OR sum of the bit stored in a prior index to a bit stored in a current index based on a corresponding index of the second set of memory locations.

12. The method of claim 8, wherein the accumulation operation is performed to at least 2 consecutive indices of the second set of memory locations.

13. The method of claim 8, wherein the combining operation comprises generating pairs of an index of the first set of memory locations and an index of the second set of memory locations.

14. The method of claim 13, wherein at least one index of the second set of memory locations is used twice.

* * * * *

UNITED STATES PATENT AND TRADEMARK OFFICE
CERTIFICATE OF CORRECTION

PATENT NO. : 8,284,833 B2
APPLICATION NO. : 13/073947
DATED : October 9, 2012
INVENTOR(S) : Hui Jin et al.

It is certified that error appears in the above-identified patent and that said Letters Patent is hereby corrected as shown below:

On the Title Page, in the Figures, insert Referral Tag -- 300 --.

On Title Page 2, Item (56), under "OTHER PUBLICATIONS", Line 19, delete "Performace" and insert -- Performance --, therefor.

In Fig. 3, Sheet 3 of 5, insert Referral Tag -- 300 --.

In Column 1, Line 38, delete "Bcrrou" and insert -- Berrou --, therefor.

In Column 3, Line 3, delete "1% of I." and insert -- 1% of 1. --, therefor.

In Column 4, Line 31, delete "The rate of the nonsystematic code is" and insert the same at Line 25 as a new line.

In Column 4, Line 61, delete "The" and insert -- the --, therefor.

In Column 5, Line 39, delete "corresponding formula is" and insert the same in Line 32, after "node, the".

In Column 5, Line 59, delete "(AGWN)" and insert -- (AWGN) --, therefor.

Signed and Sealed this
Eighth Day of January, 2013

David J. Kappos
*Director of the United States Patent and Trademark Office*